(12) United States Patent
Michalski et al.

(10) Patent No.: US 12,002,740 B2
(45) Date of Patent: Jun. 4, 2024

(54) PRINTED CIRCUIT BOARD, POWER SEMICONDUCTOR MODULE ARRANGEMENT COMPRISING A PRINTED CIRCUIT BOARD, AND METHOD FOR ASSEMBLING THE SAME

(71) Applicant: Infineon Technologies AG, Neubiberg (DE)

(72) Inventors: Sebastian Michalski, Berlin (DE); Guido Bönig, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/101,198

(22) Filed: Jan. 25, 2023

(65) Prior Publication Data
US 2023/0238314 A1   Jul. 27, 2023

(30) Foreign Application Priority Data

Jan. 27, 2022 (EP) .................................... 22153588

(51) Int. Cl.
*H01L 23/498* (2006.01)
*H01L 21/48* (2006.01)
*H05K 1/02* (2006.01)
*H01L 23/00* (2006.01)
*H01L 23/053* (2006.01)
*H01L 25/07* (2006.01)

(52) U.S. Cl.
CPC .... *H01L 23/49811* (2013.01); *H01L 21/4853* (2013.01); *H05K 1/0263* (2013.01); *H01L 23/053* (2013.01); *H01L 24/29* (2013.01); *H01L 24/32* (2013.01); *H01L 24/48* (2013.01); *H01L 24/73* (2013.01); *H01L 25/072* (2013.01); *H01L 2224/29139* (2013.01); *H01L 2224/32225* (2013.01); *H01L 2224/48225* (2013.01); *H01L 2224/73265* (2013.01)

(58) Field of Classification Search
CPC .................. H01L 23/49811; H05K 1/0263
See application file for complete search history.

(56) References Cited

U.S. PATENT DOCUMENTS

2010/0084760 A1    4/2010  Onishi
2016/0126154 A1*   5/2016  Hoehn ................ H01L 23/3735
                                              257/693

(Continued)

FOREIGN PATENT DOCUMENTS

| JP | S6216553 A  | 1/1987 |
| JP | 2001102519 A | 4/2001 |
| JP | 2002076260 A | 3/2002 |

*Primary Examiner* — Hung V Ngo
(74) *Attorney, Agent, or Firm* — Murphy, Bilak & Homiller, PLLC (57) ABSTRACT

A printed circuit board including a dielectric insulation layer having a top side facing a first side and a bottom side opposite the first side that faces a second side of the dielectric insulation layer, at least one conducting track formed on the dielectric insulation layer, and one or more conductor rails, wherein each of the one or more conductor rails is mechanically coupled to the dielectric insulation layer, and a first portion of each of the one or more conductor rails is arranged on the first side and a second portion of each of the one or more conductor rails is arranged on the second side of the dielectric insulation layer.

15 Claims, 3 Drawing Sheets

(56) References Cited

U.S. PATENT DOCUMENTS

| | | | | |
|---|---|---|---|---|
| 2017/0374755 A1* | 12/2017 | Chi | ............... | H05K 5/0013 |
| 2018/0206359 A1* | 7/2018 | McPherson | ............ | H02M 3/158 |
| 2019/0181770 A1* | 6/2019 | Martin | ............... | H05K 7/14329 |
| 2020/0357710 A1* | 11/2020 | Hoehn | ............... | H01L 23/49811 |
| 2020/0388605 A1* | 12/2020 | Esch | ............... | H01L 25/0655 |
| 2023/0170286 A1* | 6/2023 | Unrau | ............... | H01L 21/4842 257/691 |

* cited by examiner

PRINTED CIRCUIT BOARD, POWER SEMICONDUCTOR MODULE ARRANGEMENT COMPRISING A PRINTED CIRCUIT BOARD, AND METHOD FOR ASSEMBLING THE SAME

TECHNICAL FIELD

The instant disclosure relates to a printed circuit board, to a semiconductor module arrangement comprising a printed circuit board, and to a method for assembling the same.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate.

Electrically conducting terminal elements are usually provided that allow electrically contacting the semiconductor elements from outside the housing. Such electrically conducting terminal elements often include one or more conductor rails, for example. Due to the size of such power semiconductor module arrangements, which are generally designed as small as possible, high stray inductances may occur which may negatively affect the operation of the semiconductor module. Further, positioning the different elements inside the power semiconductor module arrangement precisely at their intended positions may be elaborate.

There is a need for a power semiconductor module arrangement that reduces the above mentioned drawbacks and that can be assembled easily and precisely.

SUMMARY

A printed circuit board includes a dielectric insulation layer having a top side facing a first side and a bottom side opposite the first side that faces a second side of the dielectric insulation layer, at least one conducting track formed on the dielectric insulation layer, and one or more conductor rails, wherein each of the one or more conductor rails is mechanically coupled to the dielectric insulation layer, and a first portion of each of the one or more conductor rails is arranged on the first side and a second portion of each of the one or more conductor rails is arranged on the second side of the dielectric insulation layer.

A power semiconductor module arrangement includes a housing, a substrate arranged inside the housing, and the above mentioned printed circuit board arranged inside the housing, wherein a first end of each of the one or more conductor rails is electrically and mechanically coupled to the substrate, and a second end of each of the one or more conductor rails extends to the outside of the housing.

A method includes mounting one or more conductor rails to a printed circuit board, and arranging the printed circuit board with the one or more conductor rails mounted thereto in a housing of a power semiconductor module arrangement, wherein the printed circuit board comprises a dielectric insulation layer having a top side facing a first side and a bottom side opposite the first side that faces a second side of the dielectric insulation layer, and at least one conducting track formed on the dielectric insulation layer, the conductor rails are mounted to the printed circuit board such that a first portion of each of the one or more conductor rails is arranged on the first side and a second portion of each of the one or more conductor rails is arranged on the second side of the dielectric insulation layer, and when the printed circuit board with the one or more conductor rails mounted thereto is arranged in the housing, a second end of each of the one or more conductor rails extends to the outside of the housing, and the method further comprises electrically and mechanically coupling a first end of each of the one or more conductor rails to the substrate.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
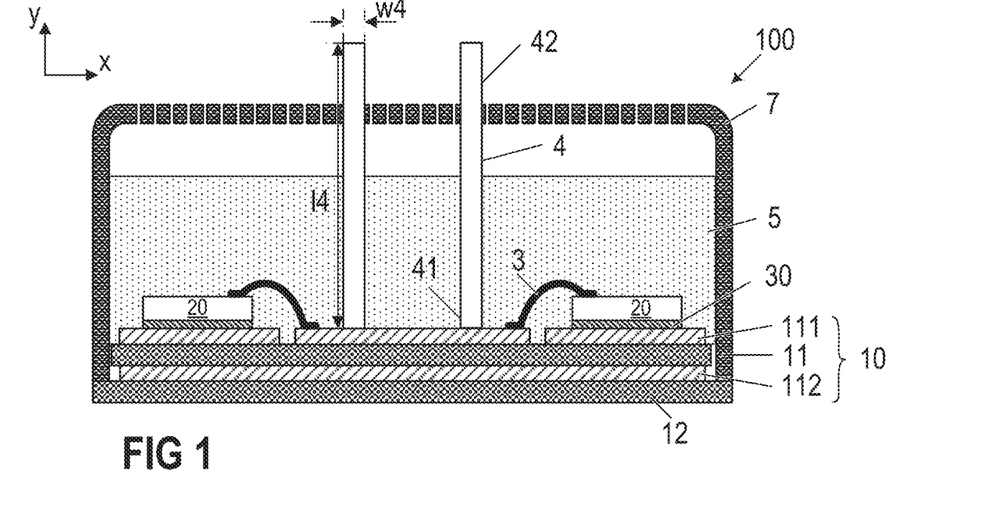
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 12 which forms a ground surface of the housing 7, while the housing 7 itself solely comprises sidewalls and a cover. This is, however, only an example. It is also possible that the housing 7 further comprises a ground surface and the substrate 10 and the base plate 12 be arranged inside the housing 7. In some power semiconductor module arrangements 100, more than one substrate 10 is arranged on a single base plate 12 or on the ground surface of a housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), SiC (silicon carbide) semiconductor element, and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connections 3 such as, e.g., bonding wires. Electrical connections 3 may also include connection plates or conductor rails (also referred to as bus bars), for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end 41, while a second end 42 of each of the terminal elements 4 protrudes out of the housing 7. The terminal elements 4 may be electrically contacted from the outside at their respective second ends 42. A first part of the terminal elements 4 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Terminal elements 4 could also protrude through the sidewalls of the housing 7 instead of through the cover. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example. For example, the second ends 42 of the terminal elements 4 may be connected to a printed circuit board (not illustrated in FIG. 1).

The power semiconductor module arrangement 100 generally further includes an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 42, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

Figure 2:
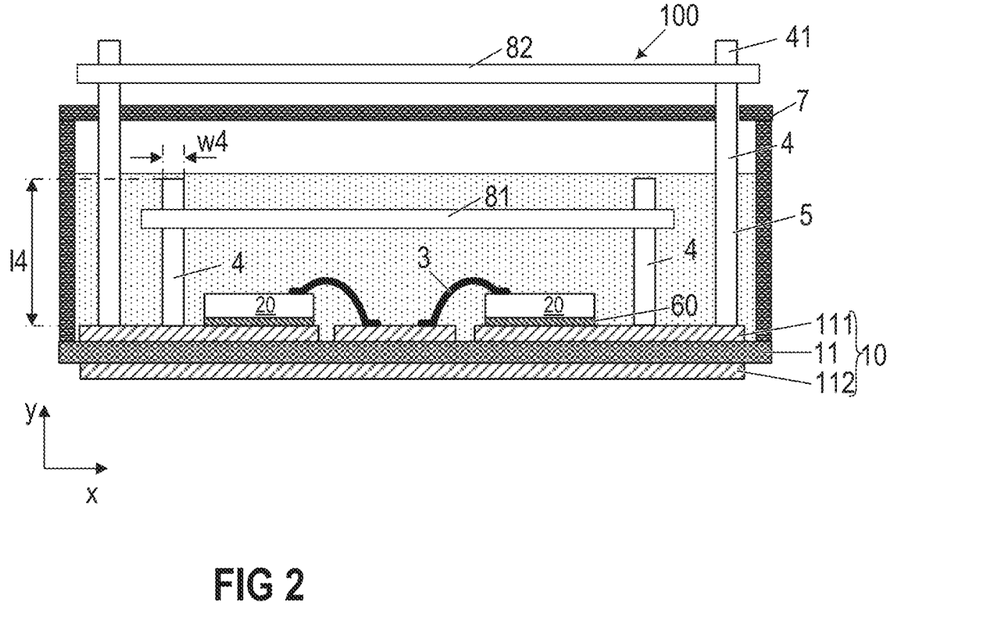
FIG. 2 is a cross-sectional view of another power semiconductor module arrangement.

Now referring to FIG. 2, another power semiconductor module arrangement 100 is schematically illustrated. The power semiconductor module arrangement 100 of FIG. 2 essentially corresponds to the power semiconductor module arrangement 100 that has been explained with respect to FIG. 1 above. However, the power semiconductor module arrangement 100 illustrated in FIG. 2 comprises a first printed circuit board 81 and a second printed circuit board 82. The first printed circuit board 81 is coupled to a first subset of the terminal elements 4 and is arranged inside the housing 7. The first subset of the terminal elements 4 may comprise shorter terminal elements that are arranged entirely inside the housing 7. A second subset of the terminal elements 4 are connected to the second printed circuit board 82 that is arranged outside the housing 7. According to another example that is not specifically illustrated, one or more terminal elements 4 may be mechanically end electrically coupled to the first printed circuit board 81 with their first ends 41, while their second end 42 extends to the outside of the housing 7. By arranging a printed circuit board 81 inside the housing 7, the power semiconductor module arrangement 100 can be implemented in a compact and space saving way, for example. This is, because at least a subset of a plurality of components that is usually arranged on an external printed circuit board 82 can be arranged on the first printed circuit board 81 instead of on the second printed circuit board 82. That is, some (or all) components can be arranged on the first printed circuit board 81, while others (or none) are arranged on a second printed circuit board 82. The size of the second printed circuit board 82, therefore, can be reduced as compared to arrangements only comprising the second printed circuit, board 82 outside the housing 7 but not the first printed circuit board 81 inside the housing 7. It is, however, also possible to omit the second printed circuit board 82 altogether.

The terminal elements 4 are generally configured to conduct control signals to and from the substrate 10. Control signals usually comprise electrical signals of 15V or less and are configured to control the function of the different semiconductor bodies 20. It is, however, also necessary to provide supply voltages to the power semiconductor module arrangement 100. The power semiconductor module arrangement 100 switches from an off state (non-working state) to an on state (working state), for example, when a supply voltage is provided. Supply voltages are generally significantly higher with more than 100V, more than 300V, more than 600V and even up to several thousands of volts. The supply voltage can be between 500V and 10 kV, or between 600V and 6.5 kV, for example.

The terminal elements 4 that have to provide comparably small voltages (and currents) generally have a comparably small cross-sectional area. That is, a length l4 of a terminal element 4 in the vertical direction y is generally significantly larger than its greatest thickness (or width) w4. The terminal elements 4 may have a round, oval, square, or rectangular cross-sectional area, for example. That is, the terminal elements 4 may be simple pins, for example. The greatest thickness w4 of a terminal element 4 may be defined by its diameter, its width or a greatest extension in a direction that is perpendicular to the vertical direction y. In a round terminal element 4, for example, the greatest thickness w4 is defined by the diameter of the terminal element 4, while in a terminal element 4 having a rectangular cross-section, the greatest thickness w4 is defined by the length of the longitudinal sides which are generally longer than the narrow sides. According to one example, each of the at least one terminal element 4 has a length l4 between its first and second end 41, 42 that is at least ten times, at least twenty times, or at least thirty times its greatest thickness w4.

Figure 6:
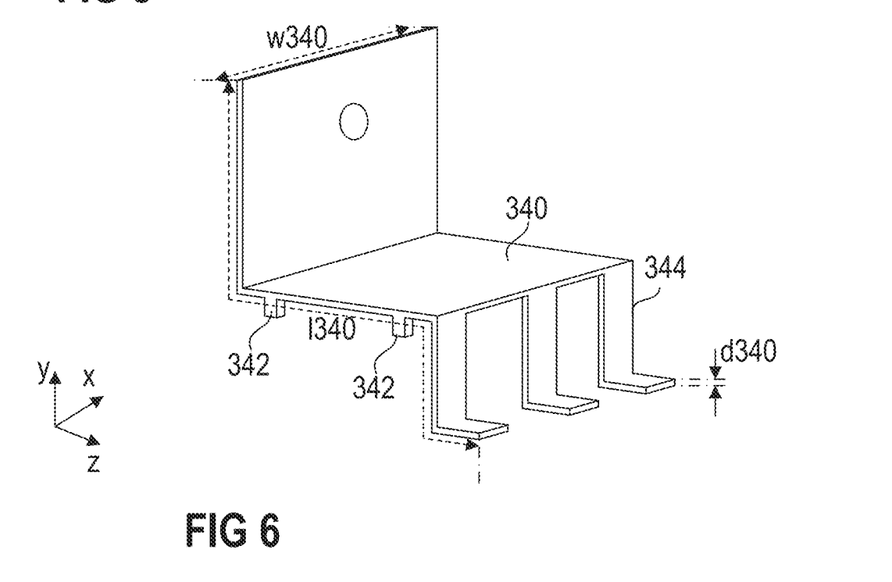
FIG. 6 schematically illustrates a diagonal view of an exemplary conductor rail.

The terminal elements 4, however, may not be able to withstand the much higher supply voltages and resulting load currents. A supply voltage, therefore, may be provided by means of conductor rails (bus bars), for example. The power semiconductor module arrangement 100 may comprise one or more conductor rails, for example. One conductor rail may be configured to be coupled to a positive potential (e.g., DC+), and another conductor rail may be configured to be coupled to a negative potential (e.g., DC−), for example. In order to be able to provide the comparably large supply voltages, each conductor rail comprises a metal plate 340 having a length l340 and a width w340 that are larger (e.g., at least 10 times larger, at least 30 times larger, or even at least 50 times larger) than a thickness d340 of the metal plate 340 (see, e.g., FIG. 6). A length l340 of the metal plate 340 may be less than ten times, or less than five times the width w340 of the metal plate 340, for example. It is even possible that the width w340 is larger than the length l340 of the conductor rail 340. The width w340 represents the greatest thickness or greatest extension of the metal plate in a direction perpendicular to the vertical direction y, similar to what has been described with respect to the terminal elements 4 above. By significantly increasing the width w340, the cross-sectional area of the conductor rails is large (e.g., at least five times, at least ten times, or at least thirty times) as compared to the cross-sectional area of the terminal elements 4. Each of the one or more conductor rails comprises a first end that is electrically and mechanically coupled to the substrate 10, and a second end extending to the outside of the housing 7. A thickness d340 of the metal plate 340 may be between 0.5 and 2 mm (millimeters), e.g., 1 mm.

Figure 3:
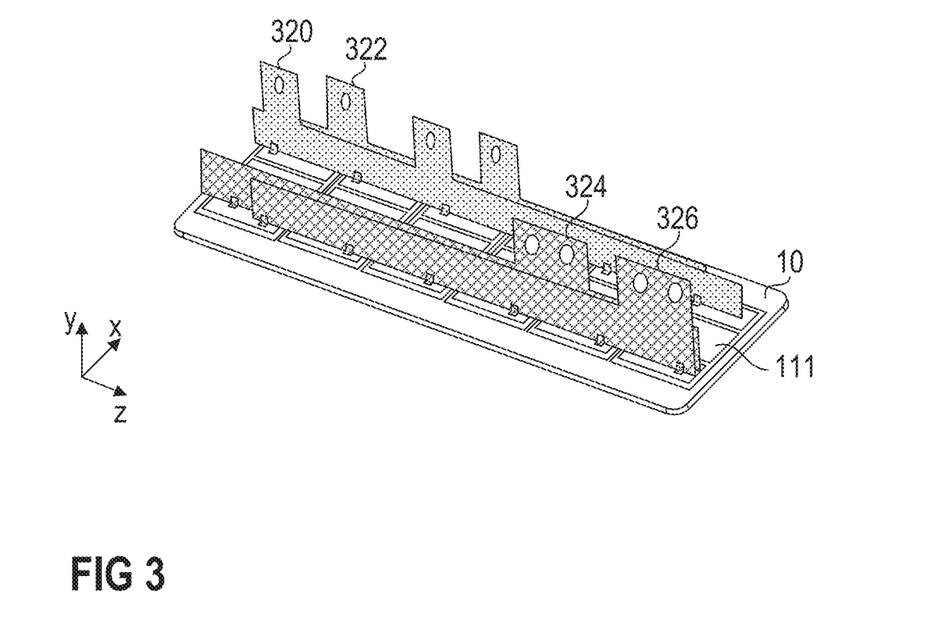
FIG. 3 schematically illustrates a dimensional view of an arrangement comprising a substrate and a plurality of conductor rails.

Now referring to FIG. 3, a substrate 10 is schematically illustrated. A first conductor rail 320, a second conductor rail 322, a third conductor rail 324, and a fourth conductor rail 326 are arranged on the substrate 10. The different conductor rails may be electrically coupled to different sections of the first metallization layer 111, for example. The first and second conductor rail 320, 322 may be electrically coupled to a first electrical potential, while the third and fourth conductor rail 324, 326 may be electrically coupled to a second electrical potential that is different from the first electrical potential, for example. In the arrangement of FIG. 3, the conductor rails 320, 322, 324, 326 are arranged centrally on the substrate 10. In power semiconductor module arrangements comprising a printed circuit board 81 arranged inside the housing, however, the conductor rails are usually moved more towards the sidewalls of the housing. In some power semiconductor module arrangements, the conductor rails are even molded into the sidewalls of the housing. It is also possible to mold conductor rails into separate mounting arrangements which are then positioned inside the housing and which are configured to hold the conductor rails in their desired positions with respect to the substrate 10 and the housing. Such power semiconductor module arrangements, however, are usually comparably expensive. Positioning conductor rails inside the housing without dedicated mounting arrangements may be cumbersome.

Figure 4:
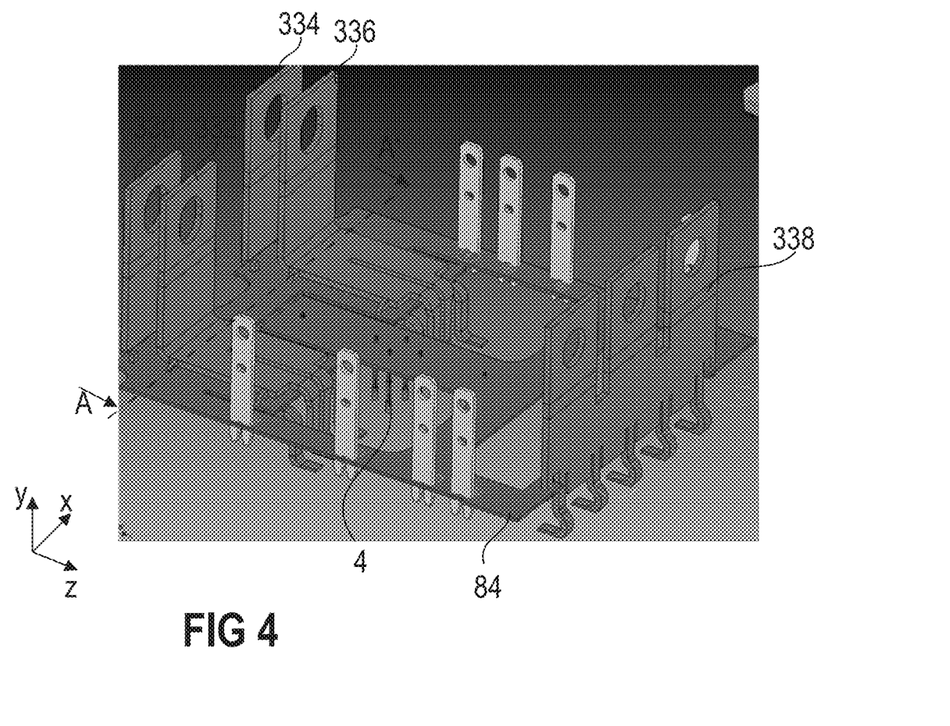
FIG. 4 schematically illustrates a printed circuit board according to one example.
Figure 5:
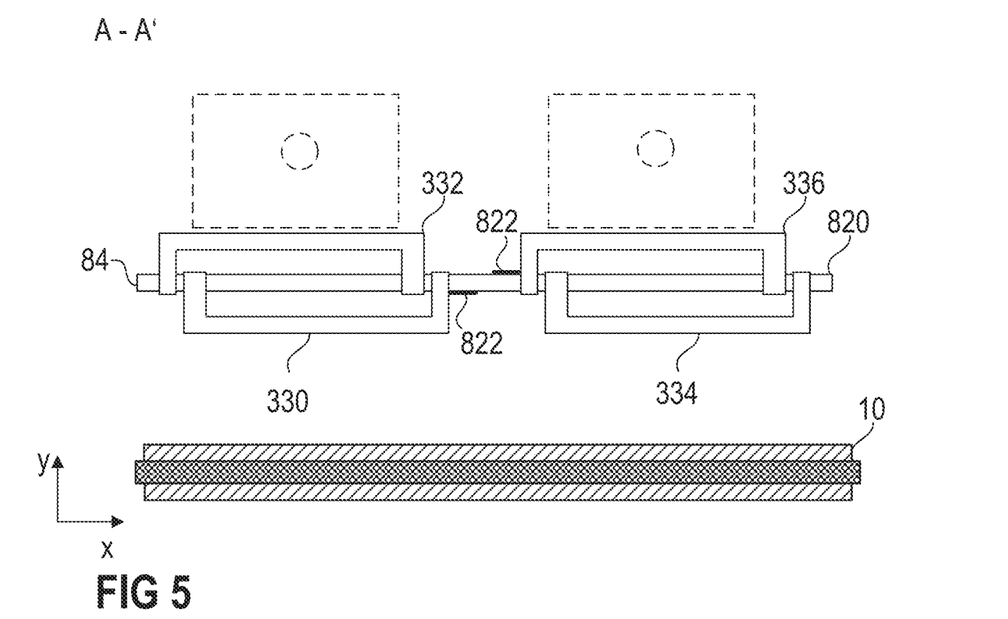
FIG. 5 schematically illustrates a cross sectional view of the printed circuit board of FIG. 4 along a section line A-A' and a substrate.

Now referring to FIGS. 4 and 5, an exemplary printed circuit board 84 is schematically illustrated. The printed circuit, board 84 comprises a dielectric insulation layer 820 having a top side facing a first side and a bottom side opposite the first side that faces a second side of the dielectric insulation layer 820. At least one conducting track 822 is formed on the dielectric insulation layer 820. It is also possible that the printed circuit board 84 comprises more than one dielectric insulation layer 820. In a multi-layer printed circuit board, conducting tracks 822 are usually also arranged between different dielectric insulation layers 820. The printed circuit board 84 further comprises one or more conductor rails. In the example illustrated in FIG. 4, five conductor rails 330, 332, 334, 336, 338 are schematically illustrated, while in the cross-sectional view of FIG. 5, only four of the conductor rails 330, 332, 334, 336 are visible. Generally, the printed circuit board 84 may comprise any number of conductor rails of one or more.

A first portion of each of the conductor rails 330, 332, 334, 336 is arranged on the first side and a second portion of each of the conductor rails 330, 332, 334, 336 is arranged on the second side of the dielectric insulation layer 820. In this way, each conductor rail 330, 332, 334, 336 can contact the substrate 10 with its first end, while its second end extends to the outside of the housing (housing not specifically illustrated in FIGS. 4 and 5). The printed circuit board 84 may comprise holes or openings that are large enough to allow conductor rails to pass through (see, e.g., conductor rails 332 and 336 in FIG. 4). It is, however, also possible that conductor rails extend past the sides of the printed circuit board 84 instead of through it (see, e.g., conductor rails 330 and 334 in FIG. 4).

Each of the conductor rails 330, 332, 334, 336 may be bent at least once along its length l340 such that it comprises at least one section extending in parallel to the dielectric insulation layer 820, and at least one section extending perpendicular to the dielectric insulation layer 820. The conductor rails 330, 332, 334, 336 illustrated in FIG. 4 comprise comparably large sections that are arranged parallel to the printed circuit board 84 (i.e., the dielectric insulation layer 820). The printed circuit board 84 illustrated in FIG. 4, further comprises an additional conductor rail 338 which extends almost entirely perpendicular to the printed circuit board 84. Each conductor rail 330, 332, 334, 336, 338, however, may comprise a plurality of welding pins 344 which extend from a main body at the first end of the respective conductor rail 340 (see, e.g., FIG. 6). A width of each of the welding pins 344 may be smaller than the largest width w340 of the metal plate 340 in the same direction. In this way, the welding pins 344 may be easily bent and welded to the substrate 10. The welding pins 344 may be bent at least once in order to provide a section extending parallel to the printed circuit board 84 and the substrate 10. This section can be welded to the substrate 10 and allows a reliable connection to be formed between the substrate 10 and the conductor rail 330, 332, 334, 336, 338.

Each of the conductor rails 330, 332, 334, 336, 338 is mechanically coupled to the printed circuit board 84. This mechanical coupling may be implemented in any suitable way. According to one example, each of the conductor rails 330, 332, 334, 336, 338 comprises one or more pins 342 extending from the metal plate 340 of the respective conductor rail 330, 332, 334, 336, 338 through a through hole in the dielectric insulation layer 820, thereby holding the conductor rail 330, 332, 334, 336, 338 in a desired position with regard to the dielectric insulation layer 820 (see FIGS. 4 and 5). The pins 342 may be soldered to the printed circuit board 84 (i.e., into the respective through hole of the printed circuit board 84), for example, in order to prevent the pins 342 from slipping out of the respective through holes. Any other ways of mechanically coupling the conductor rails 330, 332, 334, 336, 338 to the printed circuit board 84 are generally possible. In some cases, the conductor rails 330, 332, 334, 336, 338 may also be electrically coupled to the printed circuit board 84. In particular, one or more of the conductor rails 330, 332, 334, 336, 338 may be electrically coupled to one or more of the conducting tracks 822 of the printed circuit board 84.

By mechanically coupling the conductor rails 330, 332, 334, 336, 338 to the printed circuit board 84, the printed circuit board 84 functions as a mounting arrangement. The conductor rails 330, 332, 334, 336, 338 may be mounted to the printed circuit board 84 before arranging the printed circuit board 84 inside the housing 7. The conductor rails 330, 332, 334, 336, 338, therefore, are arranged on the substrate 10 and inside the housing 7 at the same time as the printed circuit board 84 is inserted into the housing 7. By arranging the printed circuit board 84 in its intended position above the substrate 10, the conductor rails 330, 332, 334, 336, 338 are also brought in their desired positions with regard to the substrate 10 simultaneously. The conductor rails 330, 332, 334, 336, 338 may be welded to the substrate 10 once they are arranged in their desired positions.

The printed circuit board 84, however, not only functions as a mounting arrangement. The printed circuit board 84 (i.e., the dielectric insulation layer 820) also provides dielectric insulation between different conductor rails that are coupled to different electrical potentials. In the examples illustrated in FIGS. 4 and 5, a first and a third conductor rail 330, 334 may be coupled to a first electrical potential (e.g., a negative potential DC−), and a second and a fourth conductor rail 332, 336 may be coupled to a second electrical potential that is different from the first electrical potential (e.g., a positive potential DC+), for example. The horizontal sections of the first and the second conductor rail 330, 332, and of the third and the fourth conductor rail 334, 336, for example, can be arranged comparably close to each other, as the printed circuit board 84 is arranged between the respective conductor rails and dielectrically insulates the first conductor rail 330 from the second conductor rail 332, and the third conductor rail 334 from the fourth conductor rail 336. The conductor rails 330, 332, 334, 336, 338, however, may be arranged in any other suitable way with respect to the printed circuit board 84.

Even further, additional components such as resistors, diodes, sensors, or similar, may be arranged on the printed circuit board 84 to provide logic circuits on the printed circuit board 84. According to one example, temperature measuring circuitry can be arranged on the printed circuit board 84 that is configured to determine one or more temperatures of the power semiconductor module arrangement. Any other kind of circuitry can be arranged on the printed circuit board 84.

As has been mentioned above, one or more of the conducting tracks 822 arranged on the printed circuit board 84 may electrically contact one or more of the conductor rails 330, 332, 334, 336, 338 (see, e.g., FIG. 5). Other conducting tracks 822 may be arranged distant from and may not be electrically coupled to any of the conducting tracks 330, 332, 334, 336, 338. Some of the conductor tracks 822 may be electrically coupled to one or more terminal elements 4, for example. Some of the conductor tracks 822 may provide electrical connections between different elements arranged on the printed circuit board 84 or on the substrate 10, for example.

According to one example, a power semiconductor module arrangement comprises exactly one printed circuit board 84 with one or more conductor rails 330, 332, 334, 336 coupled thereto. According to another example, a power semiconductor module arrangement comprises two or more printed circuit boards 84, wherein each of the two or more printed circuit boards 84 has one or more conductor rails 330, 332, 334, 336 coupled thereto. In the latter case, one or more conductor rails 330, 332, 334, 336 coupled to a first one of the two or more printed circuit boards 84 may be coupled to a positive potential (e.g., DC+), and one or more conductor rails 330, 332, 334, 336 coupled to a second one of the two or more printed circuit boards 84 may be coupled to a negative potential (e.g., DC−), for example. That is, different potentials may be provided via a different one of the two or more printed circuit boards 84. This, however, is only one example. Even if a power semiconductor module arrangement comprises two or more printed circuit boards 84, it is also possible that one conductor rail coupled to a first one of the two or more printed circuit boards 84 is coupled to a positive potential (e.g., DC+), and another conductor rail coupled to the same printed circuit boards 84 is coupled to a negative potential (e.g., DC−). In an arrangement comprising two or more printed circuit boards 84, it is also possible that one or more, but not all, printed circuit boards 84 do not have any conductor rails coupled thereto. At least one of a plurality of printed circuit, boards 84, however, is a printed circuit board as has been described above.

The invention claimed is:

1. A printed circuit board comprises:
   a dielectric insulation layer having a top side facing a first side and a bottom side opposite the first side that faces a second side of the dielectric insulation layer;
   at least one conducting track formed on the dielectric insulation layer; and
   one or more conductor rails, wherein
   each of the one or more conductor rails is mechanically coupled to the dielectric insulation layer, and
   a first portion of each of the one or more conductor rails is arranged on the first side and a second portion of each of the one or more conductor rails is arranged on the second side of the dielectric insulation layer.

2. The printed circuit board of claim 1, wherein each of the one or more conductor rails is bent at least once along its length such that it comprises at least one section extending in parallel to the dielectric insulation layer, and at least one section extending perpendicular to the dielectric insulation layer.

3. The printed circuit board of claim 2, comprising a first conductor rail and a second conductor rail, wherein
   a first section of the first conductor rail which extends in parallel to the dielectric insulation layer is arranged on the second side of the printed circuit board,
   a first section of the second conductor rail which extends in parallel to the dielectric insulation layer is arranged on the first side of the printed circuit board, and
   the dielectric insulation layer of the printed circuit board is arranged between the first section of the first conductor rail and the first section of the second conductor rail, thereby dielectrically insulating the first section of the first conductor rail from the first section of the second conductor rail.

4. The printed circuit board of claim 1, wherein each of the one or more conductor rails comprises a metal plate having a length and a width that are at least 10 times larger than a thickness of the metal plate.

5. The printed circuit board of claim 4, wherein each of the one or more conductor rails comprises one or more pins extending from the metal plate of the respective conductor rail through a through hole in the dielectric insulation layer, thereby holding the conductor rail in a desired position with regard to the dielectric insulation layer.

6. The printed circuit board of claim 5, wherein each pin of each of the one or more conductor rails is soldered to the printed circuit board.

7. The printed circuit board of claim 4, wherein the printed circuit board comprises at least one opening, and at least one of the one or more conductor rails extends through one of the at least one opening.

8. The printed circuit board of claim 4, wherein the thickness of each of the metal plates is between 0.5 and 1.5 mm.

9. The printed circuit board of claim 8, wherein the thickness of each of the metal plates is 1 mm.

10. A power semiconductor module arrangement comprising,
    a housing;
    a substrate arranged inside the housing; and
    a printed circuit board according to claim 1 arranged inside the housing, wherein a first end of each of the one or more conductor is electrically and mechanically coupled to the substrate, and a second end of each of the one or more conductor rails extends to the outside of the housing.

11. The power semiconductor module arrangement of claim 10, further comprising at least one terminal element arranged inside the housing, wherein
    each of the at least one terminal element is electrically and mechanically coupled either to the substrate or to the printed circuit board with a first end;
    a second end of each of the at least one terminal element extends to the outside of the housing; and
    each of the at least one terminal element is configured to conduct control signals to and from the substrate or the printed circuit board.

12. The power semiconductor module arrangement of claim 11, wherein the control signals comprise electrical signals of 15V or less.

13. The power semiconductor module arrangement of claim 11, wherein each of the at least one terminal element has a length between its first and second end that is at least ten times its greatest thickness.

14. The power semiconductor module arrangement of claim 10, wherein each of the one or more conductor rails is configured to provide a supply voltage of more than 100V.

15. A method comprising:
    mechanically coupling one or more conductor rails to a printed circuit board; and
    arranging the printed circuit board with the one or more conductor rails mechanically coupled thereto in a housing of a power semiconductor module arrangement, wherein
    the printed circuit board comprises a dielectric insulation layer having a top side facing a first side and a bottom side opposite the first side that faces a second side of the dielectric insulation layer, and at least one conducting track formed on the dielectric insulation layer,
    the one or more conductor rails are coupled to the printed circuit board such that a first portion of each of the one or more conductor rails is arranged on the first side and a second portion of each of the one or more conductor rails is arranged on the second side of the dielectric insulation layer, and when the printed circuit board with the one or more conductor rails coupled thereto is arranged in the housing, a second end of each of the one or more conductor rails extends to the outside of the housing, and the method further comprises electrically and mechanically coupling a first end of each of the one or more conductor rails to the substrate.

\* \* \* \* \*

UNITED STATES PATENT AND TRADEMARK OFFICE
CERTIFICATE OF CORRECTION

PATENT NO. : 12,002,740 B2
APPLICATION NO. : 18/101198
DATED : June 4, 2024
INVENTOR(S) : S. Michalski et al.

It is certified that error appears in the above-identified patent and that said Letters Patent is hereby corrected as shown below:

In the Claims

Column 10, Line 28 (Claim 10) please change "conductor is" to -- conductor rails is --

Signed and Sealed this
Twentieth Day of August, 2024

Katherine Kelly Vidal
Director of the United States Patent and Trademark Office